US012602640B2

(12) United States Patent
Hafez et al.

(10) Patent No.: US 12,602,640 B2
(45) Date of Patent: Apr. 14, 2026

(54) INTEGRATED CAPACITY MODELLING SYSTEM

(71) Applicant: Abu Dhabi National Oil Company, Abu Dhabi (AE)

(72) Inventors: Hafez H. Hafez, Abu Dhabi (AE); Jamal Nasir Bahamaish, Abu Dhabi (AE); Yousof Al Mansoori, Abu Dhabi (AE); Luigi Saputelli, Houston, TX (US); Alvaro Escorcia, Houston, TX (US); Moataz Khalaf, Abu Dhabi (AE); Richard Mohan, Abu Dhabi (AE)

(73) Assignee: Abu Dhabi National Oil Company, Abu Dhabi (AE)

( * ) Notice: Subject to any disclaimer, the term of this patent is extended or adjusted under 35 U.S.C. 154(b) by 1335 days.

(21) Appl. No.: 17/264,450

(22) PCT Filed: Jul. 31, 2018

(86) PCT No.: PCT/IB2018/055725
§ 371 (c)(1),
(2) Date: Jan. 29, 2021

(87) PCT Pub. No.: WO2020/025998
PCT Pub. Date: Feb. 6, 2020

(65) Prior Publication Data
US 2021/0312348 A1 Oct. 7, 2021

(51) Int. Cl.
E21B 41/00 (2006.01)
E21B 43/00 (2006.01)
(Continued)

(52) U.S. Cl.
CPC ........... *G06Q 10/067* (2013.01); *E21B 41/00* (2013.01); *G01V 20/00* (2024.01); *G06F 30/20* (2020.01);
(Continued)

(58) Field of Classification Search
CPC ........... G06Q 10/067; G06Q 10/06313; G06Q 10/06395; G06Q 10/103; G06Q 50/01;
(Continued)

(56) References Cited

U.S. PATENT DOCUMENTS 8,078,328 B2 12/2011 Malki et al.
8,775,141 B2 7/2014 Raphael
(Continued)

FOREIGN PATENT DOCUMENTS

CN 101379271 A 3/2009
CN 107153755 A 9/2017
(Continued)

OTHER PUBLICATIONS

Plaisant, C., et al. "Using visualization tools to gain insight into your data." SPE Annual Technical Conference and Exhibition?. SPE, 2003. (Year: 2003).*
(Continued)

*Primary Examiner* — John E Johansen
(74) *Attorney, Agent, or Firm* — Renner, Otto, Boisselle & Sklar, LLP

(57) ABSTRACT

An integrated capacity modelling system for monitoring and controlling multiple oil and gas assets, the system comprising a data acquisition module, capable of acquiring upstream data, whereas upstream data may include information from the multiple oil and gas assets; a subsurface and surface processes simulation module, capable of simulating production and injection performance of multiple oil and gas assets from the reservoir to the sales delivery point; a data assimi-
(Continued)

Figure 1:
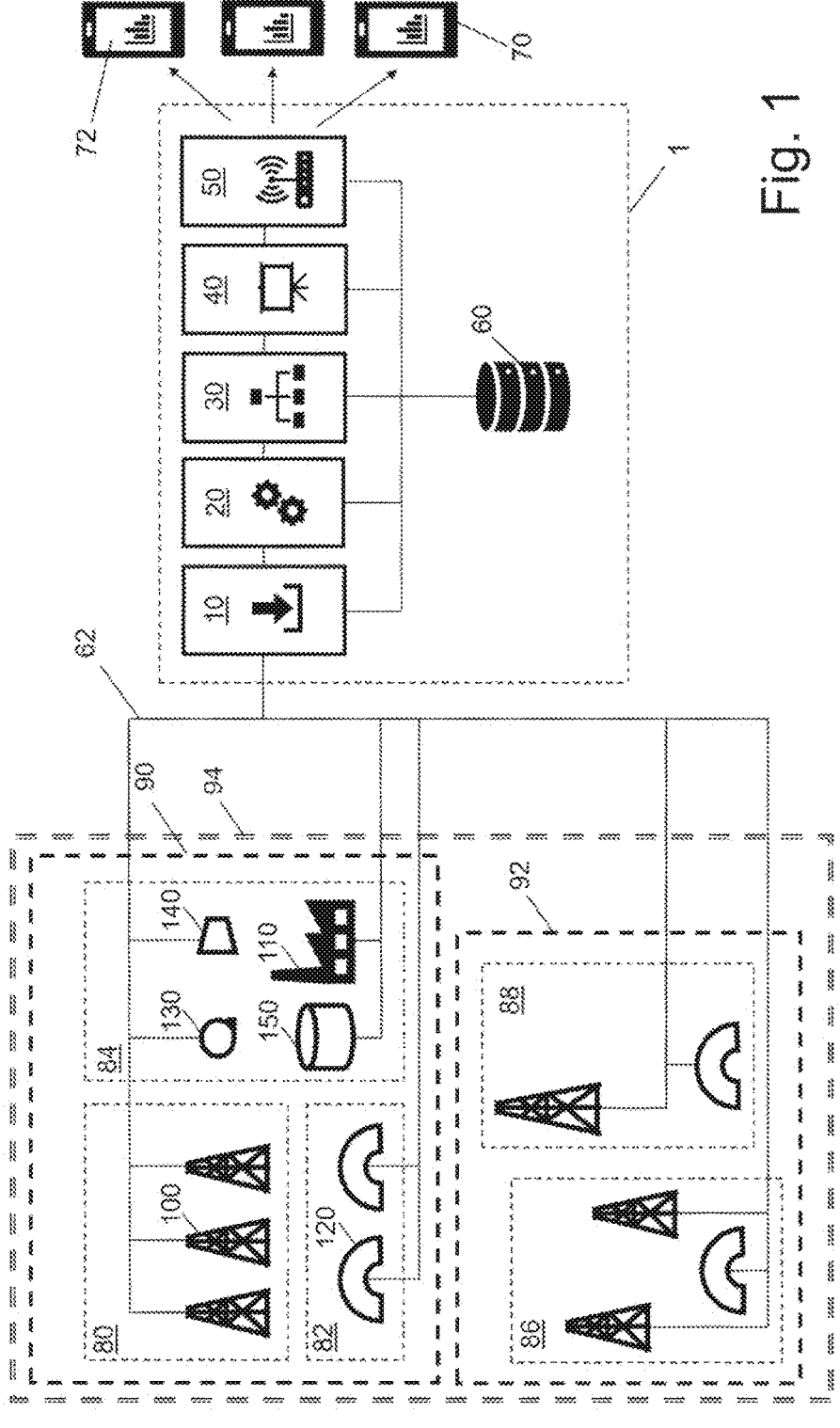

200 lation module, capable of extracting key features in the data for the purposes of calculating production capacity of multiple oil and gas assets from the acquired upstream data and from the simulation module and for building an asset capacity model thereof; a data presentation module, capable of presenting all the components of the asset capacity model of multiple oil and gas assets, wherein the presentation module is capable of presenting the asset capacity model of multiple oil and gas assets in nodes of a hierarchical structure of a plurality of levels; and a data distribution module, capable of distributing asset capacity of multiple oil and gas assets to multiple users using multiple applications.

19 Claims, 7 Drawing Sheets

(51) Int. Cl.

| | | |
|---|---|---|
| *G01V 20/00* | (2024.01) | |
| *G06F 30/20* | (2020.01) | |
| *G06Q 10/0631* | (2023.01) | |
| *G06Q 10/0639* | (2023.01) | |
| *G06Q 10/067* | (2023.01) | |
| *G06Q 10/10* | (2023.01) | |
| *G06Q 50/00* | (2024.01) | |
| *G06Q 50/02* | (2024.01) | |
| *G06Q 10/063* | (2023.01) | |

(52) U.S. Cl.
CPC . *G06Q 10/06313* (2013.01); *G06Q 10/06395* (2013.01); *G06Q 10/103* (2013.01); *G06Q 50/01* (2013.01); *G06Q 50/02* (2013.01); *E21B 43/00* (2013.01); *E21B 2200/20* (2020.05); *G06Q 10/063* (2013.01)

(58) Field of Classification Search
CPC ...... G06Q 50/02; G06Q 10/063; E21B 41/00; E21B 43/00; E21B 2200/20; G01V 20/00; G06F 30/20

USPC .......................................................... 703/10
See application file for complete search history.

(56) References Cited

U.S. PATENT DOCUMENTS

| | | | | |
|---|---|---|---|---|
| 9,228,415 | B2 * | 1/2016 | Ingham | G06F 16/283 |
| 10,087,721 | B2 | 10/2018 | Dachang et al. | |
| 10,677,022 | B2 | 6/2020 | Fleming et al. | |
| 2007/0192073 | A1 | 8/2007 | Singh et al. | |
| 2009/0276156 | A1 | 11/2009 | Kragas et al. | |
| 2014/0379317 | A1 * | 12/2014 | Sanden | G06T 3/40 |
| | | | | 703/10 |
| 2016/0154907 | A1 * | 6/2016 | Halabe | G06Q 10/063 |
| | | | | 703/7 |
| 2016/0289579 | A1 * | 10/2016 | Gonzalez | C10L 3/102 |
| 2017/0336811 | A1 | 11/2017 | Stone et al. | |

FOREIGN PATENT DOCUMENTS

| | | |
|---|---|---|
| WO | 2013188087 | 12/2013 |
| WO | 2017002048 | 1/2017 |

OTHER PUBLICATIONS

Original and English Translation of the Chinese First Office Action issued for corresponding Chinese Application No. 201880096237.0, dated Aug. 8, 2022.

Austrian Patent Office, International Search Report and Written Opinion for PCT/IB2018/055725, Mar. 4, 2019.

David Richard Mohan et al., "Upstream Data Architecture and Data Governance Framework for Efficient Integrated Upstream Workflows and Operations," Nov. 15, 2017, pp. 1-6, XP055886807, DOI: 10.2118/188962-MS.

Extended European Search Report for EP18928175.1 dated Feb. 16, 2022.

Allan, David: "Integrated Asset Modelling", Oilfield Review, 2016, pp. 1-2, XP009526001, Retrieved from the Internet; URL: https://www.slb.com/resource-library/oilfield-review/defining-series/defining-integrated-asset-modeling> [retrieved on Feb. 28, 2019].

* cited by examiner

70

INTEGRATED CAPACITY MODELLING SYSTEM

This application is a national phase of International Application No. PCT/IB2018/055725, filed Jul. 31, 2018, which is hereby incorporated herein in its entirety.

1. FIELD OF THE INVENTION

The present invention relates to an integrated capacity modelling system for monitoring and controlling multiple oil and gas assets of various sources and different producers or production sites.

2. PRIOR ART

Asset monitoring and controlling of oil and gas assets is done to periodically and timely identify production issues and make feasible and optimum recommendations in order to take actions to compensate for any shortfall and ensure production sustainability in asset/fields without compromising reservoir recovery.

In the past, short term and long-term capacity, production, and reservoir optimization decisions have been supported using asset-level integrated asset modelling (IAM). There are cases in the literature about prior art for integrated Asset Modelling. Most applications have been towards generation of scenarios and recommending decisions on specific objective results of a given specific asset or oil/gas field. There are also cases in the literature of implementation of a so called "choke model". In the case of a choke model, a series of restrictions or chokes are visualized representing the areas of production loss within and across assets, i.e. reservoir potential, as measured by well tests, that is not delivered. The resulting losses are those that occur due to reservoir management, well availability and utilization, topsides availability and utilization, i.e. the efficiency of using the available equipment; and export system. The choke model is a simplified method that does not require a representation of the full physics, i.e. it lacks hydraulic steady-state response model, not transient response of nodes, network, and fluids of the production/injection system.

Conventional IAM and production network modeling methods and systems tie in several physical components of the production/injection system in the model, considering the physical characteristics and limitations of the components, as well as other aspects such as estimated/planned. Conventional IAM methods and systems are built for modeling and optimization of a specific asset or oilfield.

U.S. Pat. No. 8,078,328 teaches a system, program product and methods for providing real-time reservoir management of one or more reservoirs across one or more fields. EP 2,839,409 teaches systems and methods for determining operating settings of a fluid production system, from a plurality of reservoirs. US 2009/0276156 teaches a system having a plurality of permanent downhole sensors to provide real-time measurements of reservoir pressure. The real-time measurements are then conveyed to a user, which information is then used for managing the reservoir. The results from the downhole measurements, are then additionally stored in an accessible computer memory.

U.S. Pat. No. 9,228,415 teaches a method for performing oilfield operations for multiple reservoirs located in plurality of locations. It includes generating a proxy model and substituting the oil field application with the proxy model. It also utilizes external or internal simulators to perform uncertainty analysis and economic calculations, used for maximizing the potential of the wells.

WO2012/015515 teaches a method for modelling a hydrocarbon reservoir that includes generating a reservoir model that has a plurality of sub regions. This invention however goes further to obtain a solution for at least one sub region by searching a database of existing solutions based on certain factors (physical, geometrical, or other parameters). If such a solution is not found, simulating the sub regions using a training simulation and using a machine learning algorithm to obtain a new solution. This new solution is then added to the database.

US 2017/336811, US 2007/0192073 and U.S. Pat. No. 8,775,141 teach "algorithms", "self-learning" or automated "optimization" of the wells. The optimization is calculated through a central computer system, and the results either implemented automatically or passed on to a user.

Conventional IAM methods and systems are implemented either for short-term operational optimizations, or for long-term optimization, but lack capabilities to run for both at a country-level with many wells and facilities, using the same model, fast enough to facilitate making timely decisions on capacity optimization Data-driven methods have been used in the past to generate reservoir models that are capable to rapidly generate scenarios. However, conventional IAM methods and systems have not implemented data-driven methods and techniques which are capable to provide an integrated performance model of a large number of individual performance models of any node of a production system, particular not a performance model of any node of a production system, including the surface production/injection network used by oil, water, and gas across the country.

It has been recognized that it is difficult or impractical to attempt to integrate disparate IAM's built for different purposes to aggregate them into a country-wide IAM, and generate valid scenarios for country-wide capacity optimization.

3. SUMMARY OF THE INVENTION

The above mentioned problems are overcome by an integrated capacity modelling system (ICM system) for monitoring and controlling multiple oil and gas assets according to claim 1.

In particular the above mention problems are solved by an integrated capacity modelling system for monitoring and controlling multiple oil and gas assets, the system comprising a data acquisition module, capable of acquiring upstream data, whereas upstream data may include subsurface characteristics and/or well configuration and/or reservoir fluid and/or production and injection historical and forecast information from the multiple oil and gas assets; a subsurface and surface processes simulation module, capable of simulating production and injection performance of multiple oil and gas assets from the reservoir to the sales delivery point; a data assimilation module, capable of extracting key features in the data for the purposes of calculating production capacity of multiple oil and gas assets from the acquired upstream data and from the simulation module and for building an asset capacity model thereof, whereas the asset capacity model is a hybrid model deriving the production potential, production availability and opportunities for compensating production shortfall in the short and mid-term, wherein the asset capacity model is composed of individual models of multiple oil and gas assets and for each relevant material, namely, oil, water and gas; a data presentation module, capable of presenting all the components of the asset capacity model of multiple oil and gas assets, wherein the presentation module is capable of presenting the asset capacity model of multiple oil and gas assets in nodes of a hierarchical structure of a plurality of levels; and a data distribution module, capable of distributing asset potential or capacity of multiple oil and gas assets to multiple users using multiple applications.

The integrated capacity modelling system due to the data acquisition module is capable to operate a multi-asset, multiple operating company (OPCO), multiple products and phases integrated network model to manage and optimize utilization of current and future capacity, having segments of the ICM model (reservoirs, wells, facilities) that are operated by multiple stakeholders under different operating agreements and terms. Due to the data distribution module the multiple stakeholders can receive actual data, particularly the static reservoir pressure of multiple oil and gas assets using multiple applications. Such data can then be used by the stakeholders for controlling the respective asset. The integrated capacity modelling system on a daily basis computes an optimum target at well, reservoir, field and generally asset level and is capable of tracking the action to manage the implementation of this target. The integrated capacity modelling system further establishes the communication between corporate headquarter and operating asset for facilitating the implementation of the recommendation based on the next day, next month, next quarter or next year target.

This integrated capacity modelling system provides for maintaining current its representation of each node in the entire system, with sufficient accuracy to generate valid scenarios on a timely manner. It is able to calculate the performance of each node based on historic data, in addition to its physical characteristics. The integrated capacity modelling system provides a continuous understanding of alternate assets/fields in terms of capacity, reservoir health, operating cost, as well as capacity and constrains of the country-wide surface production/injection network. Due to the data presentation module and its ability to present the static reservoir pressure of multiple oil and gas assets in nodes of a hierarchical structure of a plurality of levels on the one hand an optimized overview over the specific segment of interest can be provided but on the other hand a more detailed view on specific groups of assets and individual assets can be provided to the user.

By implementing the integrated capacity modelling system, it is possible to generate feasible scenarios and identifying opportunities related to business-plan current and future capacity versus production/injection, to recommend actions such as optimization of stages of field development and projects.

The acquired upstream data preferably includes subsurface characteristics and/or well configuration and/or reservoir fluid and/or production and injection historical and forecast information including economic parameters from the multiple oil and gas assets. Preferably, all such data is acquired by the data acquisition module. Preferably, the data acquisition module accesses a corporate data-hub that integrates reservoir, production, facilities and economic inputs across multiple operating companies through a common data architecture comprising of data standards, data dictionary, data model, and policies and procedures for data governance. Preferably, model outputs are delivered systematically to the corporate data-hub, becoming available for use by other business processes within each operating company.

The reservoir and well performance generated from computationally-expensive numeric simulation models are one of the possible inputs to the integrated capacity modelling system for any given field and set of scenarios. This captures reservoir and well dynamics in terms of cumulative volume and static pressure update. However, the integrated capacity modelling system by the data simulation module provides for automatic reservoir static pressure updates caused by the variation in production and injection resulting from surface equipment downtime, without the need to recur to additional runs from an external simulator.

By the data assimilation module a proxy representation of any automatically determined segment of the production/injection network can be described using the most suitable proxy type and granularity. The generated asset capacity model is a hybrid model as it is a combined physics and data driven model.

Preferably, the data presentation module is capable of collapsing and expanding the nodes of the asset data of multiple oil and gas assets of a particular level in the asset capacity model to present more general or more detailed asset data. A self-collapsing node in the ICM model can represent and reconfigure the representation of a single well or equipment, a group of wells or equipment, a field or an asset, as applicable to represent current condition or performance, current capacity or future projects, and in response to algorithmic recognition of a set of given conditions in the model.

Preferably, the node is a self-collapsing node. Thus, it can be expanded and collapsed in itself.

Preferably, the node represents a single oil and gas well or single equipment, or a group of wells or equipment, or a field or production facility. The ICM system establishes a node performance representation for a set of automatically identified nodes (reservoir, well, facilities) using performance curves automatically selecting the most suitable type of performance model, that are generated from historic performance as well as from physical characteristics of the elements of the node. The node availability, for example, is computed by the ICM based on historic mean time to fail (MTTF), mean time between failures (MTBF) and mean time to repair (AMTR), as in prior art. Each model node, as applicable, preferably has the following attributes which are function of time and scenario: Model coefficients/parameters, status (uptime vs downtime), availability (uptime/standby vs downtime), Schedule (start/stop), constraints (rate, pressure, density, quality), measured data, uncertainties, control mode. The Availability by asset including unplanned downtime is computed by the ICM system. Availability by asset refer to the computed availability of wells and system components in one asset. Node performance honors physics, historic data (boundary conditions, flow routing, and equipment status).

Preferably, the subsurface and surface processes simulation module is further capable of calculating the performance and the uncertainty of water cut of multiple oil and gas assets and wherein the data presentation module, is capable of presenting the performance and the uncertainty water cut of multiple oil and gas assets in a hierarchical structure of a plurality of levels.

Preferably, the data assimilation module is further capable of calculating the performance and the uncertainty of oil-gas ratio of multiple oil and gas assets and wherein the data presentation module, is capable of presenting the performance and the uncertainty of oil-gas ratio of multiple oil and gas assets in a hierarchical structure of a plurality of levels.

Preferably, the data assimilation module uses hybrid models including a combination of multivariate regressive models with pre-conceived model structures. Model structures includes empirical relationships derived from first principle models (physic-driven).

Preferably, the data assimilation module establishes asset and node performance by selecting the most suitable production and injection historic and physics-based simulated data, as well as from physical characteristics of elements of the node. An asset can be the combination of a reservoir, well and facilities and can have many nodes in the ICM. A node can be any of reservoir, well and other facilities. Elements of a node can be the inputs and outputs of the node.

Preferably, the subsurface and surface processes simulation module, automatically represents any determined segment of the production and injection network using the most suitable proxy type and granularity. A segment can be represented by different proxy models such as for example linear, non-linear models or models based on distributed and lumped parameters, etc.

Preferably, the subsurface and surface processes simulation module, automatically updates the reservoir performance using the variation in production and injection resulting from surface equipment downtime, wherein the reservoir performance parameters are provided to the data assimilation module without the need to recur to external simulator. This can preferably done without sacrificing the model accuracy.

Preferably, the subsurface and surface processes simulation module, uses a fluid model and/or pseudo-components which are automatically established and tuned for any segment of the production/injection network of the multiple oil and gas assets. This will reduce computational time in the subsurface and surface processes simulation module.

Preferably, the subsurface and surface processes simulation module, possess a self-collapsing node algorithm to model and represent the production and injection performance of multiple oil and gas assets, as applicable to represent current condition or performance, current capacity or future projects, and in response to algorithmic recognition of a set of given conditions in the asset capacity model.

Preferably, the data distribution module, is capable to operate a multiple asset, multiple operating company, multiple products and phases integrated network model to manage and optimize utilization of current and future capacity, having segments of the asset capacity model that are operated by multiple stakeholders under different operating agreements and terms.

Preferably, the subsurface and surface processes simulation module, identifies the segment(s) of the production/injection network in which resource or capacity would be constrained, and does not amend those segments that are not actively affected by new projects. This will reduce computational time in the subsurface and surface processes simulation module.

Preferably, the subsurface and surface processes simulation module, combines proxy representation of segments of the network with algorithms to build topologies to represent new current representation of network segments. This allows building and maintaining a coherent asset capacity model with large numbers of nodes and further allows to run scenarios in the asset capacity model with a high performance.

Preferably, the data distribution module, deploys a scenario evaluation capability in the form of a desktop or mobile device application.

Preferably, the data distribution module, provides a standalone application with online connectivity and secure-corporate limited social network integration. This provides for communication and aims to stimulate creative thinking and collaboration between the various stakeholders. Therefore, all stakeholders can cooperate in providing contributions to generate feasible tasks for leveraging production opportunities for the short and the long term, based on a given scenario.

Preferably, the data distribution module, provides a mobile device business application, comprising an algorithmic engine that uses local models, input from the scenarios generated by the subsurface and surface processes simulation module, frequent updates of production and injection data, and inputs from the social network interactions from stakeholders. Preferably, the integrated capacity modelling system considers inputs from the company's social network interactions of stakeholders for the purpose of production planning.

Preferably, the data distribution module, raises and tracks call-for-actions whenever an exception on the performance is detected by the integrated capacity model system or a production and an injection target need to be changed, for seeking interactions and approval from guided and traceable electronic remote collaboration between relevant stakeholders. Preferably, this provides an automation of the business process management. Preferably the BPM notation language 2.0 is used in the industry for business process modelling purposes. Preferably, the integrated capacity modelling system automatically generates tickets for changing and adjusting the targets of an asset, which simplifies the overall interaction between the stakeholders. The targets are provided by the system, then discussed and clarified by the operators, and then implemented by the operators. Thereby, preferably, the integrated capacity modelling system tracks all this interaction.

Preferably, the data distribution module, raises and tracks call-for-actions related to poor data and model quality, for seeking interactions and approvals from guided and traceable electronic remote collaboration between relevant stakeholders.

4. SHORT DESCRIPTION OF THE DRAWINGS

Figure 2:
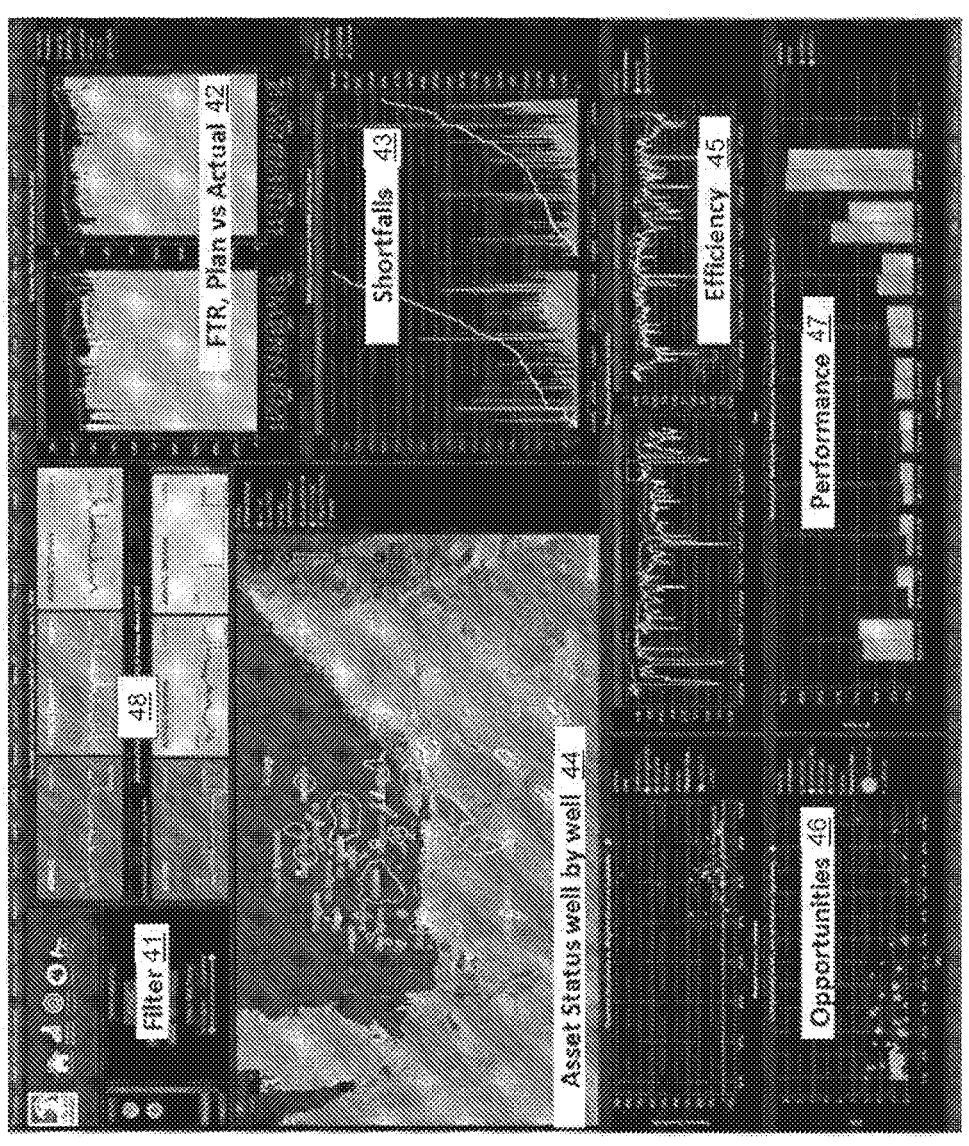
Figure 3:
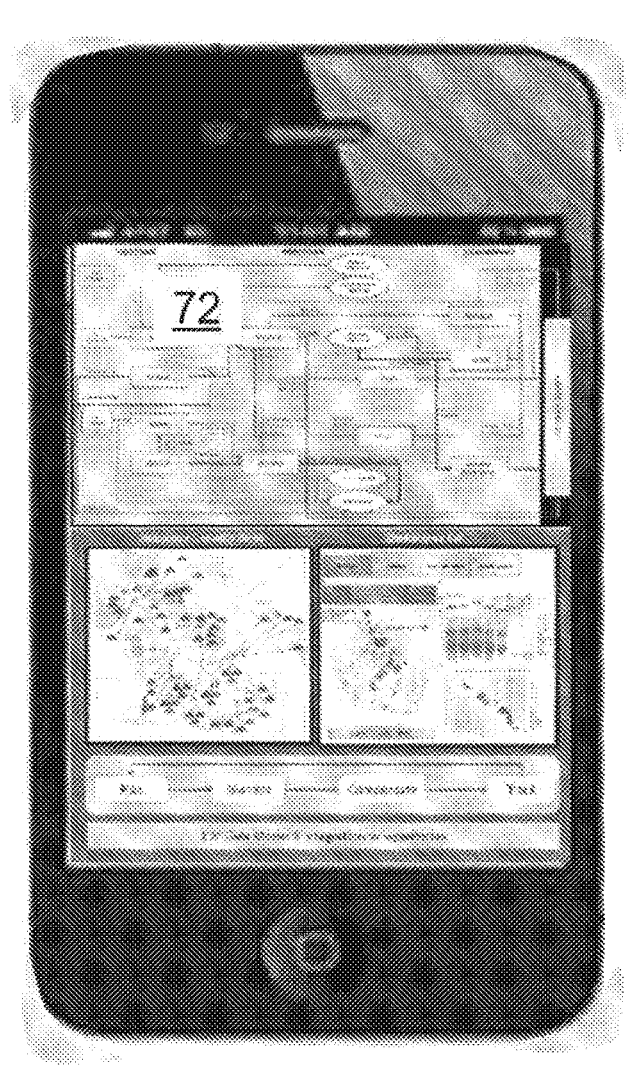
Figure 4:
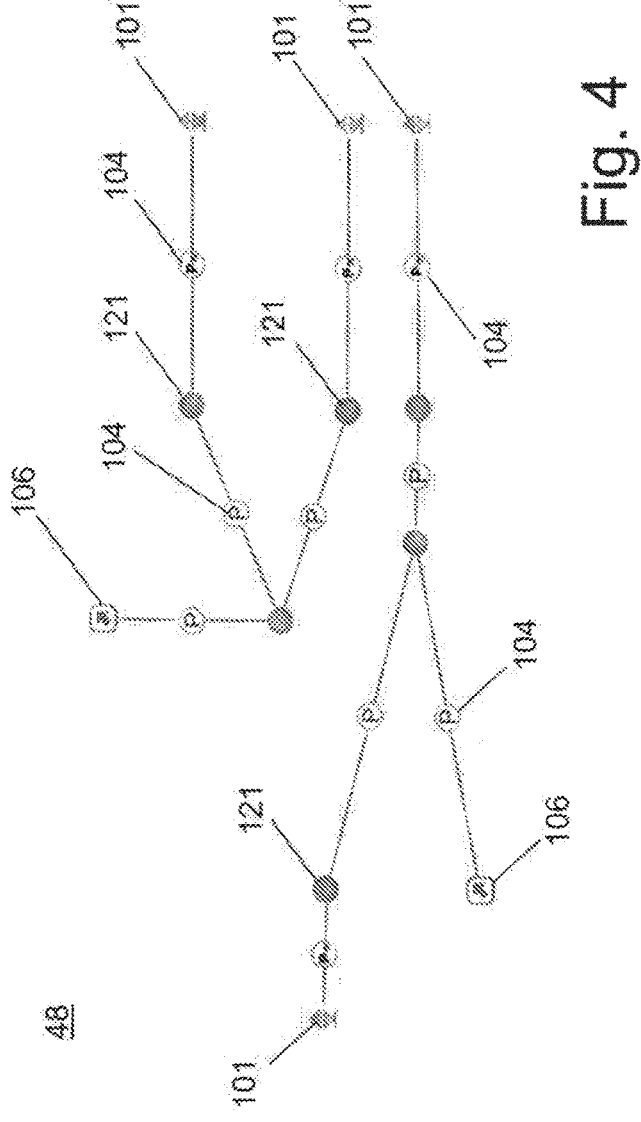
Figure 5:
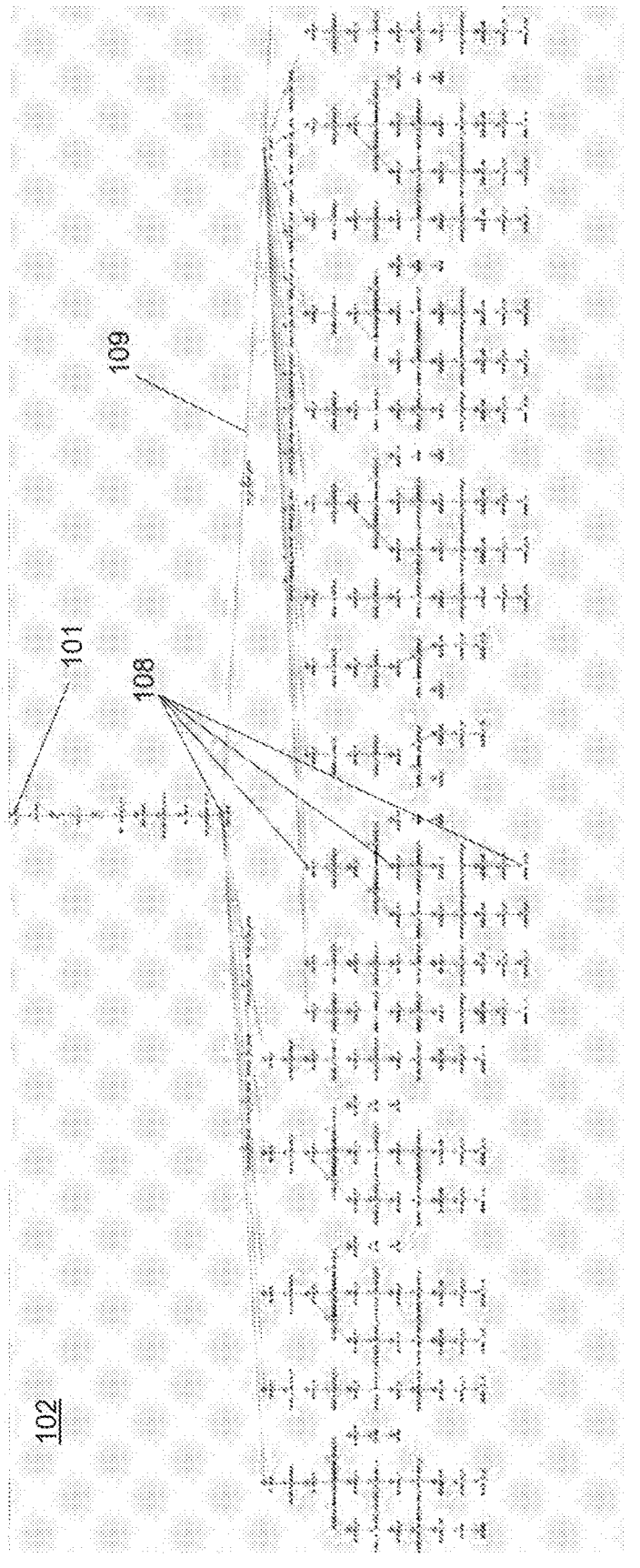
Figure 6:
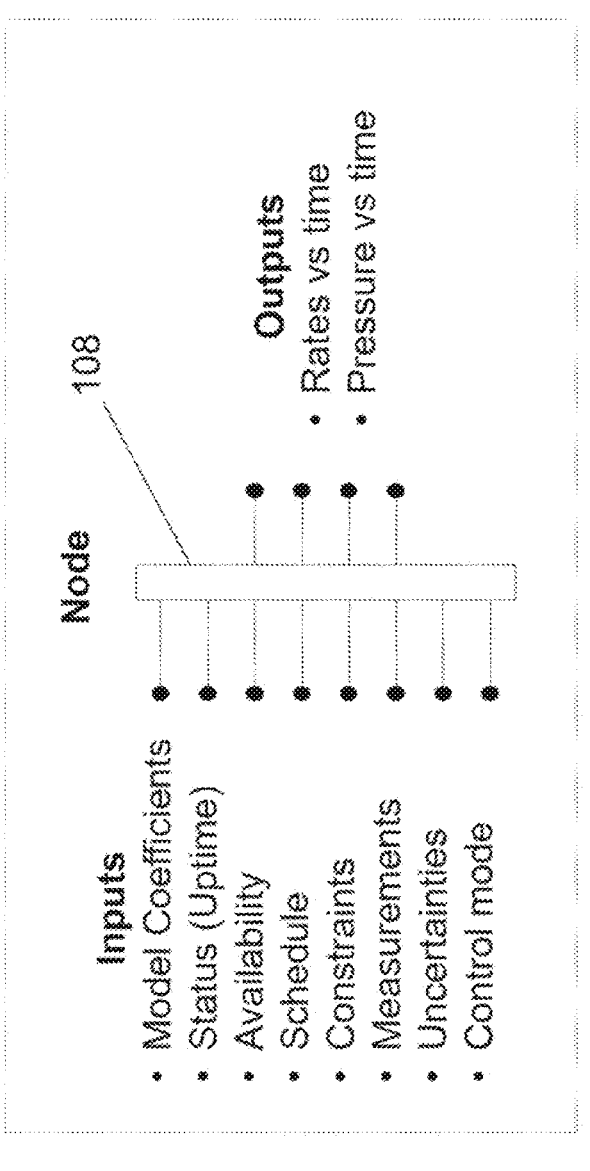
Figure 7:
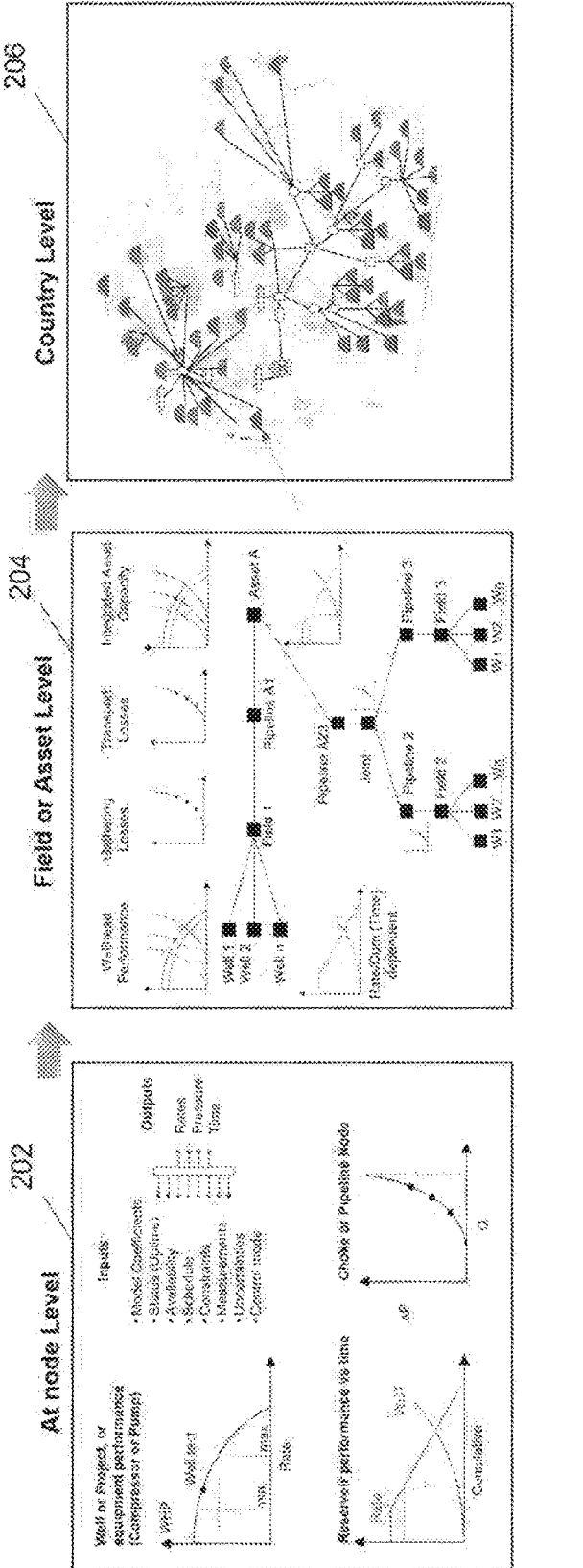

In the following a preferred embodiment of the invention is described with respect to the figures in which shows:

FIG. 1 an integrated capacity model system, multiple assets and facilities and multiple user applications;

FIG. 2 an exemplary display of a data presentation module showing different windows for the components of the asset capacity model of multiple oil and gas assets of a hierarchical structure assets;

FIG. 3 a mobile device showing different exemplary windows for the components of the asset capacity model of multiple oil and gas assets of a hierarchical structure assets;

FIG. 4 an exemplary representation of a countrywide network of multiple oil and gas assets in a top hierarchy level;

FIG. 5 an exemplary representation of one oil or gas field with expanded nodes;

FIG. 6 an exemplary representation of a node including exemplary elements of this node; and FIG. 7 exemplary process steps for building up the integrated capacity model.

5. DETAILED DESCRIPTION OF PREFERRED EMBODIMENTS

In the following, preferred embodiments of the invention are described in detail with respect to the figures.

FIG. 1 shows a very simplified scenario of oil and gas production. The scenario includes an integrated capacity model 1, multiple assets and facilities 100, 110, 120 and multiple user applications 70. The exemplary scenario comprises multiple oil or gas producers and gas or water injector wells 100, oil or gas reservoir 120, oil and/or gas production facilities 110, water injection and/or pumping facilities 130, gas compression and/or injection facilities 140 and export/storage facilities 150. The assets and facilities 100, 110, 120, 130, 140, 150 are grouped into multiple groups of different hierarchy. The first level comprises the individual asset or facility 100, 110, 120, 130, 140, 150. The second level comprises smaller groups 80, 82, 84, 86, 88 of assets and facilities 100, 110, 120, 130. 140, 150. For example, group 80 comprises three wells 100 either oil or gas producers and/or water or gas injectors. Group 86 comprises two oil, water or gas wells and one reservoir 120, group 82 comprises two distinct reservoirs 120, group 88 comprises one oil or gas well 100 and one reservoir and group 84 comprises one oil and gas production facility and one storage tank 140.

The assets and facilities 100, 110, 120, 130, 140, 150 are monitored and controlled by an integrated capacity model system 1. The integrated capacity model system 1 is connected to the assets and facilities 100, 110, 120, 130, 140, 150 via a data network 62, which may be wire bound or wireless or any combinations thereof. Preferably the data network 62 is a virtual internet based network and may use VPN and data encryption techniques for providing the required safety.

The integrated capacity model system 1 comprises a data acquisition module 10, a data simulation module 20, a data modelling module 30, a data presentation module 40, a data distribution module 50 and a database 60.

The data acquisition module 10 is capable of acquiring upstream data from the multiple oil and gas assets 100, 110, 120, 130, 140, 150. The upstream data may comprise subsurface characteristics of reservoirs, wells, well configuration, reservoir fluid information, production information, injection historical and forecast information, and other information from multiple oil and gas assets. For example, such asset data may comprise the actual status and performance. Such actual data can be electronically obtained at the asset and transferred continuously or at certain points in time to the data acquisition module 10.

The data simulation module 20 is capable of simulating production and injection data of multiple oil and gas assets 100, 110, 120, 130, 140, 150 from the reservoir to the sales delivery point.

The data assimilation module 30 is capable of extracting key features in the data for the purposes of calculating production capacity of multiple oil and assets from the upstream data acquired by the data acquisition module 10 and from data from the simulation module 20. The data assimilation module 30 can build up an asset capacity model out of this data. The asset capacity model is a hybrid model as it is combined physics and data driven. The asset capacity model allows to derive the asset production potential, production availability and opportunities for compensating production shortfall in the short and mid-term, wherein the asset capacity model is composed of individual models of multiple oil and gas assets and for each relevant material, namely, oil, water, gas, and other associated constituents including carbon dioxide, nitrogen (N2), and hydrogen sulfide (H2S).

Particularly, by the data assimilation module 30 the static reservoir pressure data of multiple oil and gas reservoirs, 120 from the acquired production and injection data and from simulated data can be determined on a monthly basis.

The data assimilation module 30 is further capable of calculating water cut and oil-gas ratios of multiple oil and gas assets 100, 110, 120, 130, 140, 150 in a hierarchical structure of a plurality of levels. For such calculations the data assimilation module 30 uses hybrid models including a combination of multivariate regressive models with preconceived model structures.

The data presentation module 40 is capable of presenting all the components of the asset capacity model of multiple oil and gas assets 100, 110, 120, 130, 140, 150, wherein the presentation module 40 is capable of presenting the asset capacity model of multiple oil and gas assets 100, 110, 120, 130, 140, 150 in nodes 108 of a hierarchical structure 102 of a plurality of levels.

For example, as it can be seen in FIG. 5, the data presentation module 40 is capable of presenting flow capacities of multiple oil and gas assets 100, 110, 120, 130, 140, 150, wherein the presentation module 40 is capable of presenting the flow rates and pressures of multiple oil and gas assets 100, 110, 120, 130, 140, 150 in nodes 108 of a hierarchical structure 102 of a plurality of levels. In FIG. 5 this hierarchical concept is shown by expanding all nodes 108 of a well 101 such that a tree 109 of all lower level nodes is generated. By selecting one of the nodes 108 of interest, and the selected scenario, further information to the node is provided by the data presentation module 40.

Thus, the data presentation module 40 is capable of collapsing and expanding the nodes 108 of the asset data of multiple oil and gas assets of a particular level to present more general or more detailed asset data. The node 108 can be a self-collapsing node to represent either more or less details or further levels of hierarchy of the assets 100, 110, 120. One node 108 can represent a single oil, water and gas well 100 or single equipment, like a facility 110, or an oil or gas reservoir 120, or a water injection/pumping facility, or a gas injection/compression facility 140, or a gas or oil storage tank 150, or a group of wells or equipment 80-88, or a field or production facility 90, 92, 94. Further, the data presentation module 40, is capable of presenting the water cut and oil-gas ratios of multiple oil and gas assets in a hierarchical structure of a plurality of levels.

An exemplary display of a data presentation module 40 showing different windows 41-48 for the components of the asset capacity model of multiple oil and gas assets of a hierarchical structure assets is shown in FIG. 2. By selecting one or a group of nodes 108 in the hierarchical structure 102 or by filtering a particular hierarchy level of the structure 102 in filter window 41 the respective data is shown in the other windows. The display and data presentation can be configured by the user according to his particular requirements. For example, in FIG. 2 window 42 shows the production design capacity (or field technical rate FTR) vs plan vs actual, therefore highlighting the shortfalls in yellow, window 43 shows the production shortfalls and the shortfalls cumulatives in the year, the window 44 shows a country-wide view for all of the asset status of multiple wells, window 46 shows the opportunities for compensating the production shortfall highlighted in 43 in the short and mid-term and windows 45 and 47 show the production efficiency. Window 48 shows overall production data in terms of different parameters like current oil and gas production of facilities 110 or the available oil and gas amount stored in tanks 120.

The data distribution module 50 is capable of distributing static reservoir pressure of multiple oil and gas assets 100, 110, 120 to multiple users using multiple applications 70. The data distribution to the user applications 70 can be done via the Internet or other wire bound or wireless networks.

FIG. 3 shows a mobile device 70 running an application 72 which presents windows provided by the data presentation module 40, like windows 42 to 48 of FIG. 2. By using mobile devices 70 the asset capacity model data of multiple oil and gas assets 100, 110, 120, 130, 140, 150 can be presented and distributed to various users. This enables collaboration, feedback and ensures a fast reaction and control of the oil and gas production network, even at country level.

FIG. 4 shows an exemplary high level representation 48 of a country level oil and gas production network. The network 48 consists of various interconnected nodes, for example nodes 101 representing an oil, water or gas well 100, nodes 104 representing export/storage facility 150, nodes 106 are sinks representing a sales point like a harbor or nodes 121 representing oil and gas export/storage facility 150. Each high level node may be extended to show the components and details of the node in a hierarchical structure. FIG. 5 shows an exemplary hierarchical structure 102 of a node 101 representing a well 101. The resulting tree 109 of the well node 101 further contains of nodes 108 representing components of the well 100.

An exemplary representation of a node 108 is shown in FIG. 6. The node 108 can have various elements such as inputs and outputs of the node 108. Inputs of the node can be model coefficients, the actual status, the availability, an operation schedule, constraints, measurements, uncertainties and the control mode of the node 108. Based on these inputs the model describing the node 108 can be used to derive outputs like the production rates at various capacity scenarios over the time or the fluid pressure over time and other parameters of the individual node 108. The outputs of the individual nodes 108 contribute to the overall asset capacity model of the oil and gas production network.

FIG. 7 explains the tasks for building up the integrated capacity model. In task 202 at node level a well or project performance model is generated. As input a well model comprises the wellhead pressure vs rate at a given date, and conditions of the well (choke, WCT, GOR). The reservoir 120 behavior is capture in reservoir proxy models which are derived from numeric simulation inputs as rate, WCT vs Cumulative, for given development plan conditions (voidage replacement ration (VRR) and Injection Plan), which can be updated quarterly or yearly. The interactions between injector and producer wells is captured in the reservoir proxy models.

In task 204 at field or asset level hybrid proxy models using physics and data are developed and trained. Therefore, (1) a procedure to automatically inherit well and IAM model properties and for predetermined scenarios is used, (2) a procedure to keep model tuned and updated as new data is available is used, and (3) by a procedure to generate ad-hoc scenarios is used.

In task 206 at country level the asset models are integrated into a network model for the country wide oil and gas network. The network model honors physics, historic data (boundary conditions, routing, equipment status) and real-time status (for key meters and available historic data). The country wide network model is used by the ICM system 1 to generate production and injection profiles for the country for multiples short and long term scenarios (base, growth, minimum cost, etc.).

The invention claimed is:

1. An oil and gas system comprising:
oil and gas producing assets and facilities; and
an integrated capacity modelling system monitoring and controlling the oil and gas producing assets and facilities, the integrated capacity modelling system comprising:
a data acquisition module, capable of acquiring upstream data, whereas upstream data includes at least one of subsurface characteristics, well configuration, reservoir fluid, production and injection historical and forecast information from the oil and gas producing assets and facilities;
a subsurface and surface processes simulation module, capable of simulating production and injection performance of multiple oil and gas assets from the reservoir to the sales delivery point;
a data assimilation module, capable of extracting key features in the data for the purposes of calculating production capacity of multiple oil and gas assets from the acquired upstream data and from the simulation module and for building an asset capacity model thereof, whereas the asset capacity model is a hybrid model deriving the production potential, design capacity, production availability and opportunities for compensating production shortfall in the short and midterm, wherein the asset capacity model is composed of individual models of multiple oil and gas assets and for each relevant material, namely, oil, water and gas and other associated constituents including carbon dioxide, nitrogen (N2), and hydrogen sulfide (H2S);
a data presentation module including a display window, the data presentation module capable of presenting all the components of the asset capacity model of multiple oil and gas assets, wherein the presentation module is capable of presenting the asset capacity model of multiple oil and gas assets in nodes of a hierarchical structure of a plurality of levels on the display window; and
a data distribution module including at least one of a desktop application, a mobile device application, a wire-bound network, and a wireless network, the data distribution module capable of distributing asset capacity of multiple oil and gas assets to multiple users using multiple applications;
wherein the data presentation module is capable of collapsing and expanding the nodes of the asset data of multiple oil and gas assets of a particular level in the asset capacity model to present more general or more detailed asset data.

2. The oil and gas system according to claim 1, wherein the node is a self-collapsing node.

3. The oil and gas system according to claim 1, wherein the node represents a single oil and gas well or single equipment, or a group of wells or equipment, or a field or production facility.

4. An oil and gas system comprising:
oil and gas producing assets and facilities; and
an integrated capacity modelling system monitoring and controlling the oil and gas producing assets and facilities, the integrated capacity modelling system comprising:
a data acquisition module, capable of acquiring upstream data, whereas upstream data includes one or more of subsurface characteristics, well configuration, reservoir fluid, and production and injection historical and forecast information from the oil and gas producing assets and facilities;

a subsurface and surface processes simulation module, capable of simulating production and injection performance of multiple oil and gas assets from the reservoir to the sales delivery point, a data assimilation module, capable of extracting key features in the data for the purposes of calculating production capacity of multiple oil and gas assets from the acquired upstream data and from the simulation module and for building an asset capacity model thereof, whereas the asset capacity model is a hybrid model deriving the production potential, design capacity, production availability and opportunities for compensating production shortfall in the short and midterm, wherein the asset capacity model is composed of individual models of multiple oil and gas assets and for each relevant material, namely, oil, water and gas and other associated constituents including carbon dioxide, nitrogen (N2), and hydrogen sulfide (H2S);

a data presentation module including a display window, the data presentation module capable of presenting all the components of the asset capacity model of multiple oil and gas assets, wherein the presentation module is capable of presenting the asset capacity model of multiple oil and gas assets in nodes of a hierarchical structure of a plurality of levels on the display window; and a data distribution module including at least one of a desktop application, a mobile device application, a wire-bound network, and a wireless network, the data distribution module capable of distributing asset capacity of multiple oil and gas assets to multiple users using multiple applications;

wherein the subsurface and surface processes simulation module is further capable of calculating the performance and the uncertainty of water cut of multiple oil and gas assets and wherein the data presentation module, is capable of presenting the performance and the uncertainty water cut of multiple oil and gas assets in a hierarchical structure of a plurality of levels.

5. An oil and gas system comprising:

oil and gas producing assets and facilities; and an integrated capacity modelling system monitoring and controlling the oil and gas producing assets and facilities, the integrated capacity modelling system comprising:

a data acquisition module, capable of acquiring upstream data, whereas upstream data may include subsurface characteristics and/or well configuration and/or reservoir fluid and/or production and injection historical and forecast information from the oil and gas producing assets and facilities;

a subsurface and surface processes simulation module, capable of simulating production and injection performance of multiple oil and gas assets from the reservoir to the sales delivery point;

a data assimilation module, capable of extracting key features in the data for the purposes of calculating production capacity of multiple oil and gas assets from the acquired upstream data and from the simulation module and for building an asset capacity model thereof, whereas the asset capacity model is a hybrid model deriving the production potential, design capacity, production availability and opportunities for compensating production shortfall in the short and midterm, wherein the asset capacity model is composed of individual models of multiple oil and gas assets and for each relevant material, namely, oil, water and gas and other associated constituents including carbon dioxide, nitrogen (N2), and hydrogen sulfide (H2S);

a data presentation module including a display window, the data presentation module capable of presenting all the components of the asset capacity model of multiple oil and gas assets, wherein the presentation module is capable of presenting the asset capacity model of multiple oil and gas assets in nodes of a hierarchical structure of a plurality of levels on the display window; and a data distribution module including at least one of a desktop application, a mobile device application, a wire-bound network, and a wireless network, the data distribution module capable of distributing asset capacity of multiple oil and gas assets to multiple users using multiple applications;

wherein the data assimilation module is further capable of calculating the performance and the uncertainty of oil-gas ratio of multiple oil and gas assets and wherein the data presentation module, is capable of presenting the performance and the uncertainty of oil-gas ratio of multiple oil and gas assets in a hierarchical structure of a plurality of levels.

6. An oil and gas system comprising:

oil and gas producing assets and facilities; and an integrated capacity modelling system monitoring and controlling the oil and gas producing assets and facilities, the integrated capacity modelling system comprising:

a data acquisition module, capable of acquiring upstream data, whereas upstream data may include subsurface characteristics and/or well configuration and/or reservoir fluid and/or production and injection historical and forecast information from the oil and gas producing assets and facilities;

a subsurface and surface processes simulation module, capable of simulating production and injection performance of multiple oil and gas assets from the reservoir to the sales delivery point;

a data assimilation module, capable of extracting key features in the data for the purposes of calculating production capacity of multiple oil and gas assets from the acquired upstream data and from the simulation module and for building an asset capacity model thereof, whereas the asset capacity model is a hybrid model deriving the production potential, design capacity, production availability and opportunities for compensating production shortfall in the short and midterm, wherein the asset capacity model is composed of individual models of multiple oil and gas assets and for each relevant material, namely, oil, water and gas and other associated constituents including carbon dioxide, nitrogen (N2), and hydrogen sulfide (H2S);

a data presentation module including a display window, the data presentation module capable of presenting all the components of the asset capacity model of multiple oil and gas assets, wherein the presentation module is capable of presenting the asset capacity model of multiple oil and gas assets in nodes of a hierarchical structure of a plurality of levels on the display window; and a data distribution module including at least one of a desktop application, a mobile device application, a wire-bound network, and a wireless network, the data distribution module capable of distributing asset capacity of multiple oil and gas assets to multiple users using multiple applications;

wherein the data assimilation module uses hybrid models including a combination of multivariate regressive models with pre-conceived model structures.

7. The oil and gas system according to claim 1, wherein the data assimilation module establishes asset and node performance by selecting the most suitable production and injection historic and physics-based simulated data, as well as from physical characteristics of elements of the node.

8. The oil and gas system according to claim 1, wherein the subsurface and surface processes simulation module, automatically represents any determined segment of the production and injection network using the most suitable proxy type and granularity.

9. An oil and gas system comprising:

oil and gas producing assets and facilities; and an integrated capacity modelling system monitoring and controlling the oil and gas producing assets and facilities, the integrated capacity modelling system comprising:

a data acquisition module, capable of acquiring upstream data, whereas upstream data may include subsurface characteristics and/or well configuration and/or reservoir fluid and/or production and injection historical and forecast information from the oil and gas producing assets and facilities;

a subsurface and surface processes simulation module, capable of simulating production and injection performance of multiple oil and gas assets from the reservoir to the sales delivery point;

a data assimilation module, capable of extracting key features in the data for the purposes of calculating production capacity of multiple oil and gas assets from the acquired upstream data and from the simulation module and for building an asset capacity model thereof, whereas the asset capacity model is a hybrid model deriving the production potential, design capacity, production availability and opportunities for compensating production shortfall in the short and mid-term, wherein the asset capacity model is composed of individual models of multiple oil and gas assets and for each relevant material, namely, oil, water and gas and other associated constituents including carbon dioxide, nitrogen (N2), and hydrogen sulfide (H2S);

a data presentation module including a display window, the data presentation module capable of presenting all the components of the asset capacity model of multiple oil and gas assets, wherein the presentation module is capable of presenting the asset capacity model of multiple oil and gas assets in nodes of a hierarchical structure of a plurality of levels on the display window; and a data distribution module including at least one of a desktop application, a mobile device application, a wire-bound network, and a wireless network, the data distribution module capable of distributing asset capacity of multiple oil and gas assets to multiple users using multiple applications;

wherein the subsurface and surface processes simulation module, automatically updates the reservoir performance parameters using the variation in production and injection resulting from surface equipment downtime, wherein the reservoir performance parameters are provided to the data assimilation module without the need to recur to external simulator.

10. The oil and gas system according to claim 1, wherein the subsurface and surface processes simulation module, uses a fluid model and/or pseudo-components which are automatically established and tuned for any segment of the production/injection network of the oil and gas producing assets and facilities.

11. The oil and gas system according to claim 1, wherein the subsurface and surface processes simulation module, possess a self-collapsing node algorithm to model and represent the production and injection performance of multiple oil and gas assets, as applicable to represent current condition or performance, current capacity or future projects, and in response to algorithmic recognition of a set of given conditions in the asset capacity model.

12. The oil and gas system according to claim 1, wherein the data distribution module, is capable to operate a multiple asset, multiple operating company, multiple products and phases integrated network model to manage and optimize utilization of current and future capacity, having segments of the asset capacity model that are operated by multiple stakeholders under different operating agreements and terms.

13. The oil and gas system according to claim 1, wherein the subsurface and surface processes simulation module, identifies the segment(s) of the production/injection network in which resource or capacity would be constrained, and does not amend those segments that are not actively affected by new projects.

14. The oil and gas system according to claim 1, wherein the subsurface and surface processes simulation module, combines proxy representation of segments of the network with algorithms to build topologies to represent new current representation of network segments.

15. The oil and gas system according to claim 1, wherein the data distribution module, deploys a scenario evaluation capability in the form of a desktop or mobile device application.

16. The oil and gas system according to claim 1, wherein the data distribution module, provides a standalone application with online connectivity and secure-corporate limited social network integration.

17. The oil and gas system according to claim 1, wherein the data distribution module, provides a mobile device business application, comprising an algorithmic engine that uses local models, input from the scenarios generated by the subsurface and surface processes simulation module, frequent updates of production and injection data, and inputs from the company's social network interactions from stakeholders.

18. The oil and gas system according to claim 1, wherein the data distribution module, raises and tracks call-for-actions whenever an exception on the performance is detected by the integrated capacity model system or a production and an injection target need to be changed, for seeking interactions and approval from guided and traceable electronic remote collaboration between relevant stakeholders.

19. The oil and gas system according to claim 1, wherein the data distribution module, raises and tracks call-for-actions related to poor data and model quality, for seeking interactions and approvals from guided and traceable electronic remote collaboration between relevant stakeholders.

* * * * *